United States Patent [19]

Leonowich

[11] Patent Number: 5,315,270
[45] Date of Patent: May 24, 1994

[54] PHASE-LOCKED LOOP SYSTEM WITH COMPENSATION FOR DATA-TRANSITION-DEPENDENT VARIATIONS IN LOOP GAIN

[75] Inventor: Robert H. Leonowich, Muhlenberg Township, Berks County, Pa.

[73] Assignee: AT&T Bell Laboratories, Murray Hill, N.J.

[21] Appl. No.: 936,824

[22] Filed: Aug. 28, 1992

[51] Int. Cl.⁵ .......................................... H03L 7/089
[52] U.S. Cl. .................................... 331/1 A; 331/11; 331/17; 331/25
[58] Field of Search ...................... 331/1 A, 11, 16, 17, 331/25

[56] References Cited

U.S. PATENT DOCUMENTS 4,644,420  2/1987  Buchan ........................... 375/120 X
5,173,664 12/1992  Petersen et al. ..................... 331/1 A

OTHER PUBLICATIONS

Gardner, Floyd M., IEEE Trans. Commun., vol. COM-28, pp. 1849-1858, Nov. 1980, "Charge-Pump Phase-Lock Loops".
Grebene, Alan B., "Bipolar and MOS Analog Integrated Circuit Design," Wiley-Interscience Pub., 1984, pp. 627-678 Micro-Linear Corp.
Duttweiler, D. L., The Bell System Technical Journal, vol. 55, No. 1, Jan. 1976, pp. 37-58, "The Jitter Performance of Phase-Locked Loops Extracting Timing From Baseband Data Waveforms".
National Semiconductor Mass Storage Handbook, 1989 Edition pp. 9-34 to 9-40.
National Semiconductor Mass Storage Handbook, 1989 Edition pp. 9-6 to 9-8.
Cordell, Robert R. et al,; IEEE Journal of Solid State Circuit vol. SC-14, No. 6, Dec. 1979, pp. 1003-1009 "A 50 MHz Phase-and Frequency-Locked Loop".

Primary Examiner—Siegfried H. Grimm
Attorney, Agent, or Firm—Michael J. Urbano

[57] ABSTRACT

The loop gain of a phase locked loop is made to be controllably responsive to the transition density of an input data signal. In one embodiment a charge pump, positioned between the phase detector and the loop filter, supplies pulse-amplitude-modulated current pulses to the loop filter, the amplitude of pulses being related to the data transition density.

18 Claims, 4 Drawing Sheets

PHASE-LOCKED LOOP SYSTEM WITH COMPENSATION FOR DATA-TRANSITION-DEPENDENT VARIATIONS IN LOOP GAIN

BACKGROUND OF THE INVENTION

This invention relates to phase locked loop (PLL) systems in which the density of data transitions in the data signal varies.

Monolithic PLL circuits have become the basic building blocks of many consumer and industrial electronic systems. In telecommunication data systems, for example, the PLL is an integral part of the clock recovery subsystem. The PLL may be used to recover the clock signal from the data signal; the recovered clock may then be used, for example, to regenerate the data signal.

The basic PLL system generally comprises three elements; (1) a phase detector, (2) a loop filter, and (3) a voltage controlled oscillator (VCO), which are interconnected in a feedback system as shown in FIG. 12.1 of "Bipolar and MOS Analog Integrated Circuit Design," A. B. Grebene, John Wiley & Sons (1984). The phase detector compares the phase of an input signal $V_s$ with the phase of the VCO and generates a control voltage $V_d$. This voltage $V_d$ is filtered by the loop filter, the output of which is applied to the control terminal of the VCO to control its frequency of oscillation.

The loop gain, $K_L$, of the PLL is defined as follows:

$$K_L = K_D K_o \quad (1)$$

where $K_D$ (V/rad) is the phase detector conversion gain, and $K_o$ (Hz/V) is the voltage-to-frequency conversion gain of the VCO.

It is well known that the phase detector gain $K_D$, and hence the loop gain, of a clock recovery PLL is dependent on the transition density of the data signal. (D. L. Duttweiler, BSTJ, Vol. 55, No. 1 (1976)). That is, when the data signal undergoes few data transitions, the phase detector has periods of time when no data transitions occur to compare with the VCO recovered clock. The effective phase detector gain $K_{DD}$ is then degraded by a factor $D < 1$ defined as $$D = f_{trans}/f_{clk} \quad (2)$$

and $$K_{DD} = K_D D \quad (3)$$

where $f_{trans}$ is the frequency of the data transitions and $f_{clk}$ is the frequency of the recovered clock.

Consider two cases illustrated by FIGS. 1 and 2. In both cases the PLL is locked to an input data signal, but the clock signal is lagging the data signal by a phase error $\Delta$. In FIG. 1, there is only one rising clock cycle transition between adjacent data transitions; thus, the degrading factor $D = 1$. But, in FIG. 2, there are three rising clock cycle transitions between adjacent data transitions; thus $D = \frac{1}{3}$. Therefore, there are three times the number of error corrections in the $D = 1$ case than in the $D = \frac{1}{3}$ case. This difference effectively makes the phase detector gain of FIG. 2, $K_{D2} = \frac{1}{3} K_{D1}$, where $K_{D1}$ is the phase detector gain of FIG. 1, even though the phase detectors themselves have physically the same implementation.

This data-dependent variation of the phase detector gain will cause variations in the PLL closed loop dynamics and may be undesirable. For example, in a second order active loop filter PLL (Grebene, supra, FIG. 12.9), the natural frequency, the damping factor and the 3 dB frequency all decrease as $K_{DD}$ decreases, but the jitter peaking increases. This effect is particularly troublesome in systems in which the PLLs (or repeaters which include the PLLs) are cascaded. For example, in token ring systems data may be inserted/extracted at different nodes such that different repeaters/PLLs see different data streams. With prior art PLLs, the transfer function of the PLL shifts with transition density such that some PLLs may lose lock; others may not.

SUMMARY OF THE INVENTION

In accordance with one aspect of my invention, the loop gain of a PLL is made to be essentially constant by compensating for the dependence of that gain on the data transition density of an input data signal. The loop gain is made to be controllably responsive to the transition density of the input data signal so as to increase the loop gain when the density is relatively low and, conversely, to decrease the gain when the density is relatively high. In one embodiment of this method, the number of clock transitions (either rising or falling) between adjacent data transitions is counted and used to adjust the loop gain. In a preferred embodiment, the average loop gain is essentially constant with changes in transition density.

In accordance with another aspect of my invention, this method is illustratively implemented in a PLL which includes a modulator for altering the loop gain in response to the difference between the data transition density of the input signal and the clock signal. Illustratively the modulator comprises a charge pump located between the phase detector and the loop filter. The charge pump supplies current pulses to the filter, the amplitude of the pulses being related to the data transition density; the lower the data transition density in a given time interval, the higher the pulse amplitude (and conversely).

The invention is particularly attractive for use in systems in which there is an upper bound on the number of data bits which can occur without a data transition also occurring. Examples of such systems are those employing Manchester coding or Run Length Limited coding schemes.

It is also attractive for use in systems where the PLLs are cascaded because the PLL transfer functions, like the loop gain, are independent of transition density and, so, regardless of what data stream a PLL sees, it always maintains the locked condition.

BRIEF DESCRIPTION OF THE DRAWINGS

The invention, together with its various features and advantages, can be readily understood from the following more detailed description taken in conjunction with accompanying drawing, in which.

DETAILED DESCRIPTION

As noted above, the invention in general makes the loop gain of a PLL system controllably responsive to the transition density of a data signal. In particular, the invention makes the loop gain essentially constant even though the transition density may vary.

Figure 3:
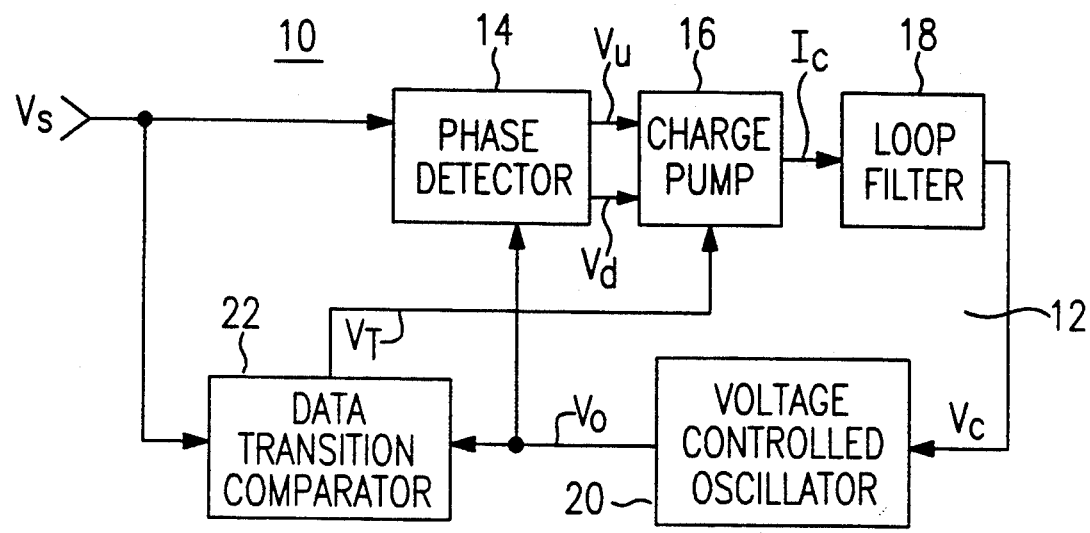
FIG. 3 is a block diagram of a PLL system in accordance with one embodiment of the invention.

A block diagram of a PLL system 10 in accordance with one embodiment of the invention is shown in FIG. 3. The system includes a feedback loop 12 formed by a phase detector 14, a loop gain modulator (e.g., a charge pump 16), a loop filter 18, and a voltage controlled oscillator (VCO) 20. Located outside the loop 12, a data transition comparator 22 compares the transitions of the input data signal $V_s$ with those of the clock $V_o$ (i.e., the VCO output) and generates pulse width modulated (PWM) control pulses $V_T$. The PWM pulses $V_T$ control the magnitude of pulse amplitude modulated (PAM) current pulses $I_c$ supplied by charge pump 16 to loop filter 18. The latter, in turn, generates a control voltage $V_c$ which controls the frequency of VCO 20. Loop filter 18, which may be active or passive, VCO 20, which may be a relaxation oscillator, and transition comparator 22, which may simply be a differentiator followed by rectifier, are all well-known in the art.

Phase detector 14 may be any one of a class of well known detectors suitable for handling non-periodic data signals. As shown in FIG. 3, phase detector 14 has two inputs: the input data signal $V_s$ and the output signal (clock) $V_o$ of VCO 20. Detector 14 compares the phases of $V_s$ and $V_o$ and generates two outputs, $V_d$ and $V_u$, but three allowable states. That is, these outputs are logic levels applied to the charge pump 16: (1) $V_u$ alone is true when the output frequency of VCO 20 needs to be increased, (2) $V_d$ alone is true when the output frequency of VCO 20 needs to be decreased, and (3) $V_u$ and $V_d$ are false simultaneously when the output frequency of VCO 20 is to remain unchanged. Both $V_d$ and $V_u$ are never true simultaneously. This type of tri-state phase detector used in conjunction with a charge pump is described by F. M. Gardner in an article entitled "Charge-Pump Phase-Lock Loops," *IEEE Transactions on Communications*, Vol. COM-28, No. 11, p. 1849 (1980). Although Gardner describes the charge pump as "nothing but a three-position, electronic switch that is controlled by the three states" of the phase detector, in the present invention the combination of the charge pump 16 and the data transition comparator 22 function in a unique manner to supply PAM current pulses $I_c$ to the loop filter 18. The amplitude of these pulses is related to the transition density of the input data signal $V_s$. Since the transition density changes as a function of time, the PLL dynamically adjusts the current pulse amplitudes so that the phase detector gain, and hence the loop gain, compensates for variations in density. Effectively, therefore, the gain and hence the loop dynamics are maintained essentially constant over a relatively wide range of data transition densities.

Figure 1:
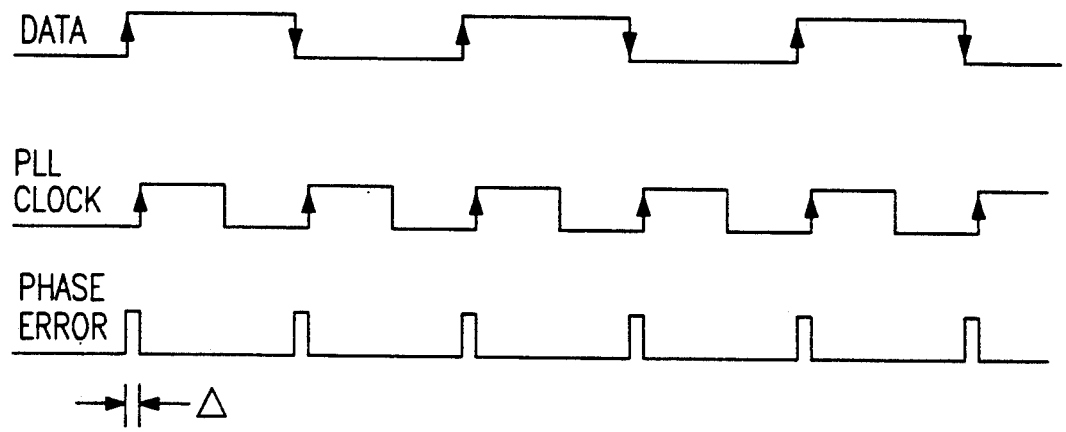
FIGS. 1 and 2 are waveforms used to describe the adverse effect of data transition dependent gain on PLL performance.
Figure 2:
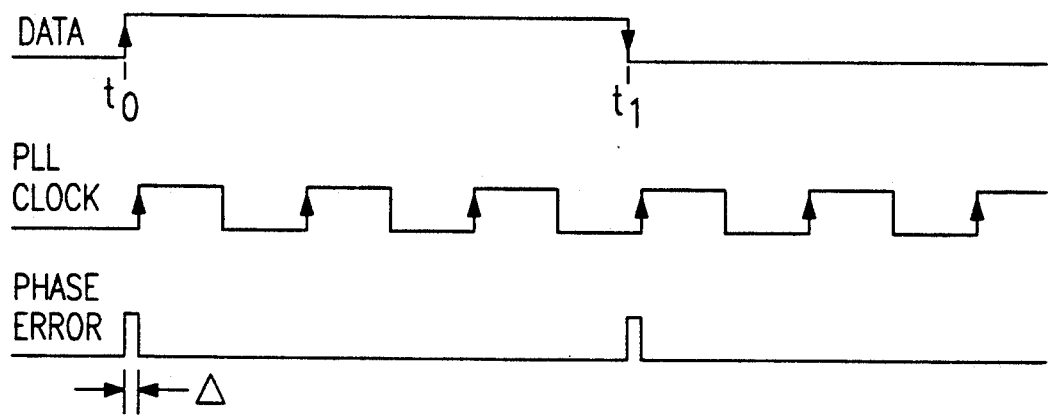

The effective phase detector gain (and hence the loop gain) is dynamically adjusted by means of charge pump 16 and comparator 22. The comparator 22 counts the number of clock cycles n which occur between data transitions and generates a suitable control signal $V_T$ which enables the charge pump 16 to deliver a current pulse of amplitude nI to the loop filter 18. For example, in FIG. 2 (the case of a degrading factor of $D=\frac{1}{3}$) during the interval $t_o-t_1$, three clock cycles have occurred before the data transition at $t_1$. Consequently, the comparator 22 supplies a suitable control signal $V_T$ to charge pump 16 so that a current pulse of amplitude 3I (not shown in FIG. 2) is applied to the loop filter at approximately $t_1$. The sign of the pulse may be either positive or negative depending on whether the clock signal is lagging or leading the data signal, respectively.

Figure 6:
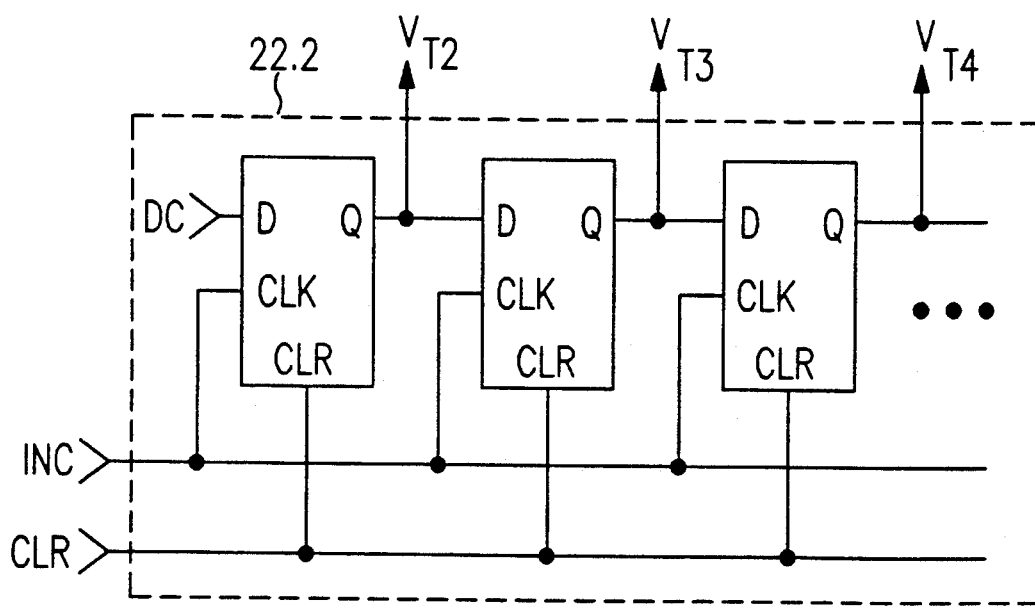
FIG. 6 is an illustrative implementation of the counter of FIG. 3.
Figure 4:
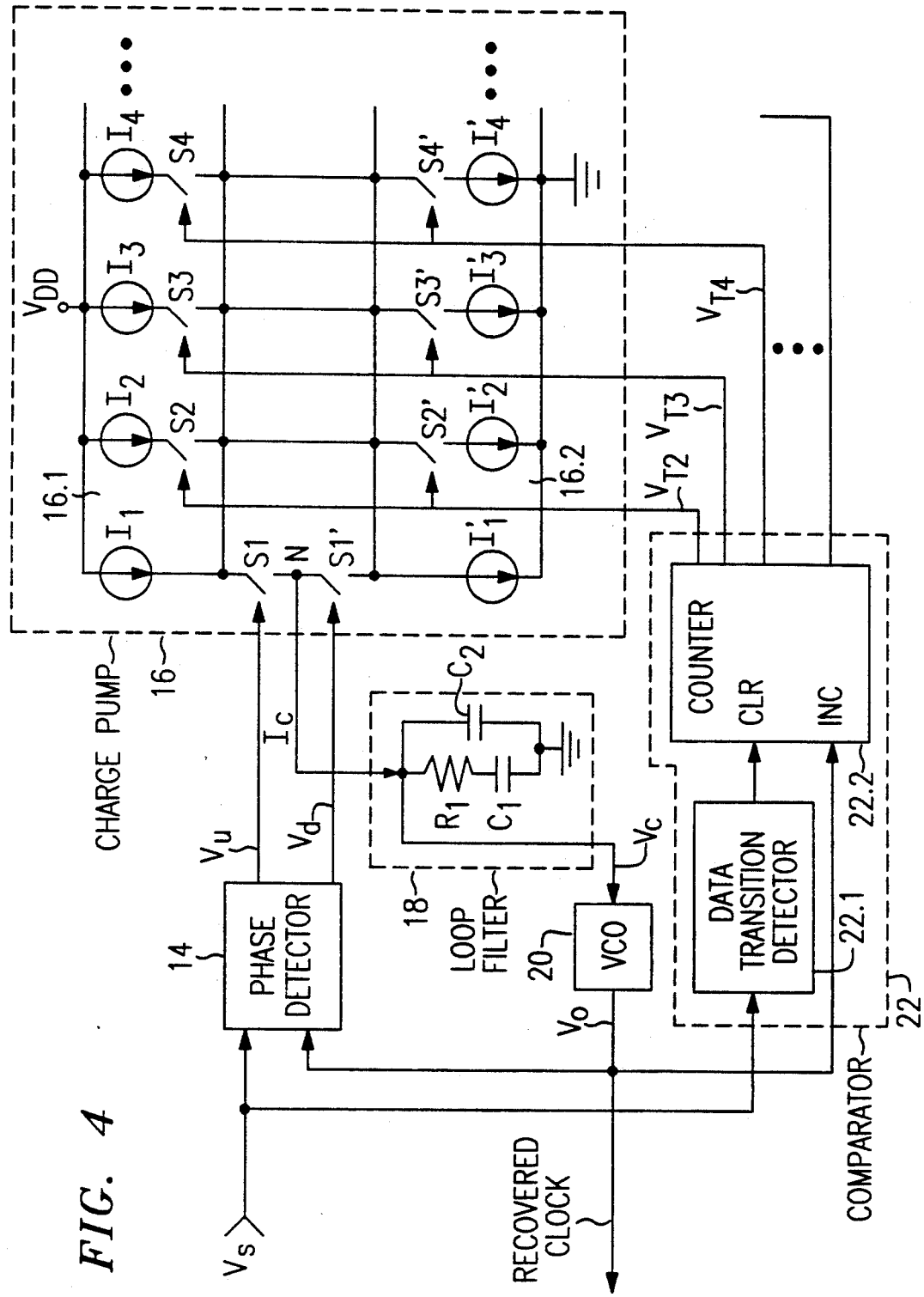
FIG. 4 is a combined block diagram and circuit schematic of the embodiment of FIG. 3.
Figure 5:
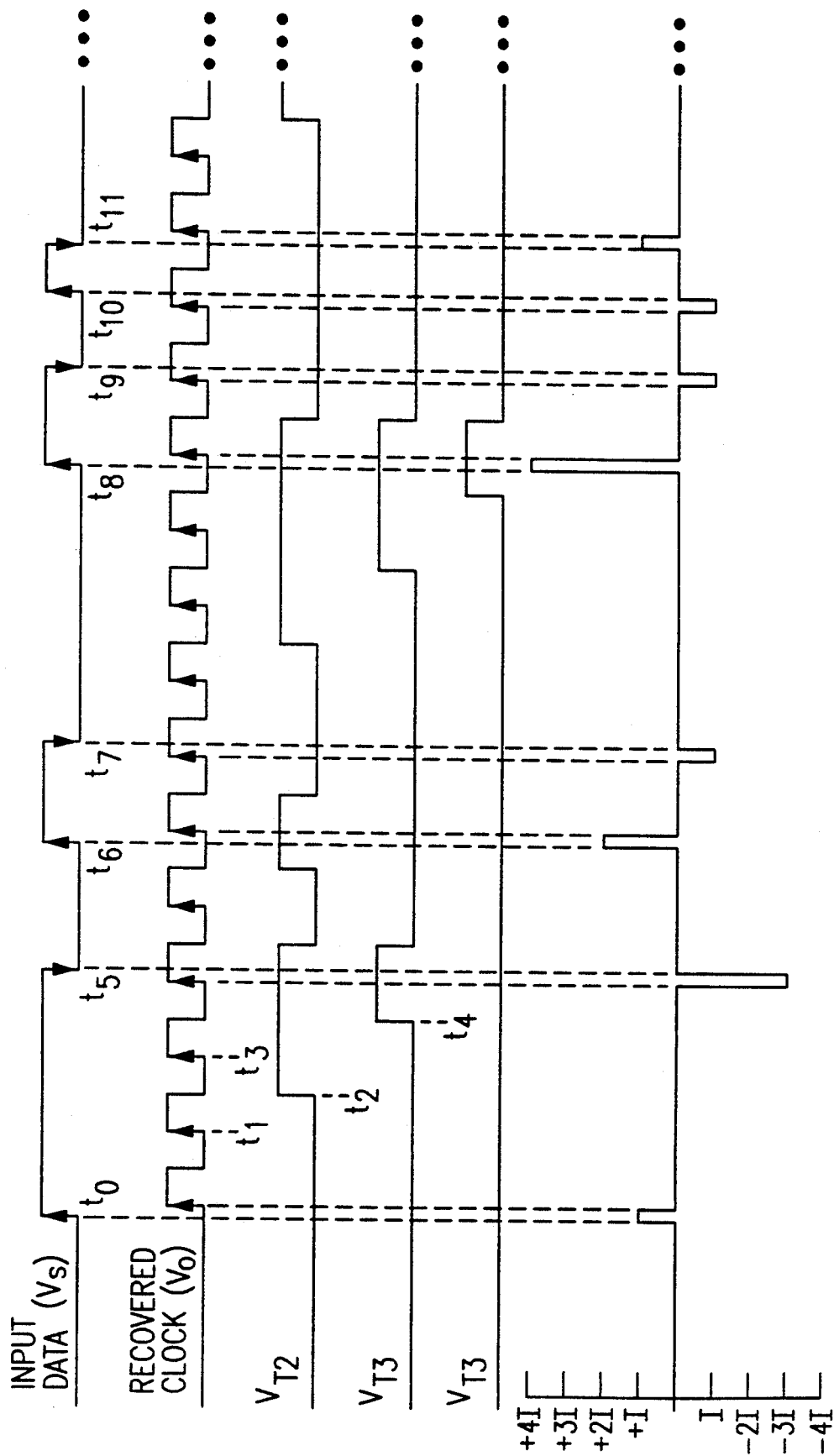
FIG. 5 shows waveforms useful in explaining the operation of the embodiment of FIG. 4.

The manner in which the PAM control current is generated can be better understood from the following more detailed description of FIGS. 4–6 in which corresponding components of FIG. 3 and FIG. 4 have been given identical reference numerals. In this embodiment the loop filter 18 is a standard second-order filter having the series combination of a resistor $R_1$ and a capacitor $C_1$ connected between its input terminal and ground, with smoothing capacitor $C_2$ connected in parallel with the $R_1$-$C_1$ combination. On the other hand, the data transition comparator 22 comprises a data transition detector 22.1 (e.g., a differentiator followed by a rectifier) with its input coupled to $V_s$ and its output coupled to the clear input CLR of counter 22.2. The increment input INC of the counter is coupled to $V_o$, whereas the parallel outputs of the counter are control voltages $V_{Ti}$ (i=2, 3, 4 . . . ) coupled to the charge pump 16 so as to control the state of switches $S_i$ and $S_i'$ (i=2, 3, 4 . . . ).

The charge pump itself includes a first bank 16.1 of parallel-connected current sources $I_i$ (i=1, 2, 3 . . . ) coupled through switch S1 to node N for delivering a positive current control pulse $I_c$ of amplitude nI (n=1, 2, 3 . . . ) to the loop filter, and, similarly, a second bank 16.2 of parallel-connected current sources $I_i'$ (i=1, 2, 3 . . . ) coupled through switch S1' to node N for delivering a negative current control pulse $I_c$ to the loop filter. The amplitude of the current pulses is determined by the number of switches $S_i$ or $S_i'$ (i=2, 3, 4 . . . ) which are closed under control of $V_{Ti}$, whereas the duration (width) of the current pulse $I_c$ is determined by the length of time that switches S1 or S1' are closed under control of the phase detector outputs $V_u$ and $V_d$, respectively. Thus, the width of the current pulses $I_c$ is related to the phase error generated by the phase detector and as a result may vary considerably (e.g., 0–50%). In the interest of simplicity, however, FIG. 5 shows the pulses $I_c$ to be of equal duration.

In operation of the embodiment of FIG. 4, the phase detector 14 compares the rising edge (for example) of the clock signal $V_o$ to a data transition of input signal $V_s$. Assuming a positive VCO gain $K_o$ and an "early" clock transition, then a pulse would be generated on the "down" output $V_d$. This pulse would cause the control voltage $V_c$ to decrease, thus slowing the frequency of $V_o$ (i.e., the clock rate). Note, however, the clock in FIG. 5 is shown to have a constant frequency in the interests of simplicity (i.e., in many cases the actual frequency shift would be imperceptible in a schematic drawing). Conversely, if the clock transition were "late", a pulse would be generated on the "up" output $V_u$ to accelerate the clock rate.

Consider now the operation of charge pump 16 in which we assume each current source supplies a current of magnitude I. A pulse on $V_u$ closes switch S1 and connects bank 16.1 to loop filter 18. The amplitude of the control current $I_c$ supplied to the filter is I+kI; that is I (from $I_1$) plus kI (k=0, 1, 2 . . . ) depending on how many of the switches $S_i$ (i=2, 3 . . . ) are closed. The duration of $I_c$ is dependent on the duration of $V_u$. Similar comments apply to a pulse $V_d$ applied to switch S1'.

In both cases counter 22.2 controls the closure of switches $S_i$ and $S_i'$ (i=2, 3 ...) by counting the number of clock transitions which occur between adjacent data transitions. If a data transition occurs ($t_o$, FIG. 5), transition detector 22.1 clears the counter 22.2 and $V_{Ti}$ (i=2, 3 ...) are all set to zero, thus disabling the current sources $I_i$ and $I_i'$ (i=2, 3 ...). If a data transition occurs after $t_o$, the current source $I_i$ or $I_i'$ supplies the necessary control current. However, if no data transition occurs by the second rising clock edge at $t_1$, as shown in FIG. 5, then $V_{T2}$ goes high on the trailing edge of that clock cycle (at $t_2$) which closes switches $S_2$ and $S_2'$ and prepares $I_2$ and $I_2'$ for injection of control current into the loop filter. (As noted earlier, whether the positive control current $I_2$ or the negative one $I_2'$ is injected depends on whether a pulse appears on $V_u$ or $V_d$.) Similarly, if there continues to be no data transition by $t_3$, the rising edge of the third clock cycle, then at $t_4$ $V_{T3}$ goes high, closes $S_3$ and $S_3'$ so that current sources $I_3$ and $I_3'$ are prepared to inject current into the loop filter. Note, during the interval $t_o - t_5$ when there is no data transition, both $V_u$ and $V_d$ are low, the third state of the tri-state phase detector. Finally, when a data transition occurs at $t_5$, the phase detector detects the transition and applies a control voltage $V_d$ to the charge pump so that a control current pulse $I_c = -3I$ is applied to the loop filter. In a similar fashion, FIG. 5 shows, for example, additional control current pulses of amplitude $+2I$, $-I$, $+4I$, $-I$, $-I$, and $+I$, respectively, being generated by the charge pump at times $t_6$ to $t_{11}$, respectively. In this manner, the phase detector gain, and hence the loop gain, is adjusted to compensate for the changing transition density of the data signal.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. There are many alternative designs of counter 22.2 well-known in the art which would be suitable for use in the inventive PLL system. One such design is shown in FIG. 6 wherein a plurality of D-flip flops are arranged in tandem. A dc voltage corresponding to a logic state is applied to the D input of the first flip flop, and the control voltages ($V_{Ti}$) (i=2, 3 ...) are taken from the Q outputs of the respective flip flops. The increment signal INC from the VCO is applied to the clock inputs CLK of the flip flops, and the clear signal CLR from the data transition detector 22.1 is applied to their clear inputs.

In addition, although the foregoing description relates, for illustrative purposes, to analog PLL systems, the principles of the invention are also applicable to all-digital PLLs, e.g., a PLL with a digital loop filter and digital phase detector, a PLL implemented in an FPGA or a DSP, or a PLL implemented in software in a microprocessor.

Finally, it should be noted that the invention is advantageously used in systems where the data is coded so that there is an upper bound on the number of data bits which can occur between data transitions. Examples of such coding schemes are Manchester coding and Run Length Limited coding. However, the invention is not limited to such use in such systems. Thus, if the embodiments of the invention shown in FIG. 3 or FIG. 4 were used in system without an upper bound of the type described above, then the PLL would still provide loop gain compensation, and hence be an improvement over the prior art, up to the point where the charge pump had already switched in the maximum number of current sources provided by the physical design even though a relatively low transition density data signal may be "demanding" more current.

I claim:

1. In a phase-locked loop system for locking a clock signal to an input data signal, a method characterized by the steps of:
    (a) counting the number of clock signal transitions which occur between data signal transitions, and
    (b) altering the loop gain of said system in response to said counting step (a) by injecting a current pulse into the loop only at said data transitions.

2. The method of claim 1 wherein in step (b) the average loop gain is maintained essentially constant with changes in transition density of the input signal.

3. The method of claim 1 wherein said system includes a phase detector for comparing the phase of said input signal to that of said clock signal and wherein step (b) includes altering the effective gain of said phase detector, in response to said counting step (a).

4. The method of claim 3 wherein said system includes a loop filter for filtering the output of said phase detector and wherein step (b) includes injecting current pulses into said loop filter, the amplitude of said pulses being related to the number of said transitions counted in step (a).

5. The method of claim 4 wherein said injecting step includes using the output of said phase detector to determine when said current pulse are injected into said loop filter.

6. A method of locking a clock signal to an input data signal in a phase-locked loop, comprising the steps of:
    (a) generating said clock signal,
    (b) comparing the phase of said data signal with that of said clock signal to generate a first control signal, said comparing step having a characteristic gain measured in volts per radian,
    (c) modulating the frequency of said clock signal in response to said first control signal, characterized by the steps of:
    (d) counting the number of rising (or falling) clock signal transitions which occur between adjacent data signal transitions, and
    (e) altering said gain in response to said counting step by injecting a current pulse into said loop only at said data transactions.

7. The method of claim 6 wherein, in step (e) the gain is altered in a manner to maintain it essentially constant with changes in the transition density of said input signal.

8. The method of claim 6 wherein step (e) includes generating current pulses in response to said first control signal, the amplitudes of said pulses being related to the numbers counted in step (d), and the modulation of said clock signal frequency in step (c) being responsive to said current pulses.

9. A data system comprising
a phase-locking loop subsystem for locking a clock signal to an input data signal, said loop subsystem having a characteristic loop gain related to the difference Δ in phase between said input signal and said clock signal, and a modulator for altering said loop gain in response to the difference between the data transition density of said input signal and that of said clock signal, said modulator including a charge pump which injects a current pulse into said loop only at said data transitions.

10. The system of claim 9 wherein said modulator alters the loop gain in a manner to maintain said gain essentially constant with changes in the density of said input signal.

11. The system of claim 9 wherein said modulator includes a comparator for generating a first control signal related to said difference in data transition density, and a source for injecting current pulses into said loop in response to said first control signal.

12. The system of claim 11 wherein said comparator counts the number of rising (or falling) clock signal transitions between adjacent data signal transitions, and said source injects pulses the amplitudes of which are related to said numbers counted by said comparator.

13. The system of claim 12 wherein said loop subsystem includes a tri-state phase detector for generating second control signals responsive to the difference in phase between said input signal and said clock signal, and the timing of the injection of said pulses is responsive to said second control signals generated by said phase detector.

14. The system of claim 13 wherein said loop subsystem comprises an oscillator for generating said clock signal, a loop filter for providing a filtered third control signal for altering the frequency of said oscillator, and said source supplies said current pulses to said filter so as to generate said third control signal.

15. A phase-locked loop subsystem for locking a clock signal to an input data signal comprising an oscillator for generating said clock signal in response to a first control signal, a phase detector for comparing the phase of said input signal with that of said clock signal and for generating second control signals in response to a phase difference $\Delta$ between said signals, a comparator for counting the number of rising (or falling) clock signal transitions which occur between adjacent data signal transitions to generate third control signals, the durations of said third control signals being related to said numbers, a low pass filter, the output of said filter providing said first control signal to said oscillator, and a current source for injecting amplitude modulated current pulses into said filter only at said data transitions, the timing of said pulses being responsive to said second control signals from said phase detector, and the amplitude of said pulses being responsive to said third control signals from said comparator and being effective to maintain the loop gain essentially constant with changes in the transition density of said input signal the amplitude of each said pulses being related to said number of clock signal transitions and the width of each of said pulses being related to $\Delta$.

16. The method of claim 1 wherein the amplitude of said pulses is related to said number of clock transitions, wherein said data and clock signals are out of phase by an amount $\Delta$, and wherein in the width of said pulses is related to $\Delta$.

17. The method of claim 6 wherein the amplitude of said pulses is related to said number of clock transitions, wherein said data and clock signals are out of phase by an amount $\Delta$, and wherein the width of said pulses is related to $\Delta$.

18. The method of claim 9 wherein the magnitude of said pulses is related to the number of clock transitions which occur between data transitions, and wherein the width of said pulses is related to $\Delta$.

* * * * *